(12) United States Patent
Bunch et al.

(10) Patent No.: US 7,449,960 B2
(45) Date of Patent: Nov. 11, 2008

(54) FREQUENCY MODULATION LINEARIZATION SYSTEM FOR A FRACTIONAL-N OFFSET PLL

(75) Inventors: Ryan Lee Bunch, Greensboro, NC (US); Alexander Wayne Hietala, Phoenix, AZ (US); Scott Robert Humphreys, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 206 days.

(21) Appl. No.: 11/415,808

(22) Filed: May 2, 2006

(65) Prior Publication Data
US 2006/0197613 A1 Sep. 7, 2006

Related U.S. Application Data

(63) Continuation-in-part of application No. 11/047,258, filed on Jan. 31, 2005, now Pat. No. 7,098,754.

(51) Int. Cl.
*H03L 7/085* (2006.01)
*H03L 7/089* (2006.01)
*H03L 7/099* (2006.01)

(52) U.S. Cl. .................. 331/1 A; 332/104; 375/308

(58) Field of Classification Search ............... 332/103, 332/104, 105; 375/302, 308; 331/1 A
See application file for complete search history.

(56) References Cited

U.S. PATENT DOCUMENTS

| 6,008,703 | A | 12/1999 | Perrott et al. |
| 6,366,177 | B1 | 4/2002 | McCune et al. |
| 6,377,784 | B2 | 4/2002 | McCune |
| 7,010,276 | B2 | 3/2006 | Sander et al. |
| 7,158,494 | B2 | 1/2007 | Sander et al. |
| 2001/0033200 | A1* | 10/2001 | Staszewski et al. ............ 331/18 |
| 2006/0109155 | A1* | 5/2006 | Jensen ......................... 341/144 |

* cited by examiner

*Primary Examiner*—Robert J. Pascal
*Assistant Examiner*—Gerald Stevens
(74) *Attorney, Agent, or Firm*—Withrow & Terranova, P.L.L.C.

(57) ABSTRACT

A linearization system is provided for a Fractional-N Offset Phase Locked Loop (FN-OPLL) in a frequency or phase modulation system. In general, the linearization system processes a modulation signal to provide a linearized modulation signal to a fractional-N divider in a reference path of the FN-OPLL such that a frequency or phase modulation component at the output of the FN-OPLL is substantially linear with respect to the modulation signal.

21 Claims, 4 Drawing Sheets

US 7,449,960 B2

FREQUENCY MODULATION LINEARIZATION SYSTEM FOR A FRACTIONAL-N OFFSET PLL

RELATED APPLICATIONS

The present application is a Continuation-in-Part (CIP) of U.S. patent application Ser. No. 11/047,258, entitled FRACTIONAL-N OFFSET PHASE LOCKED LOOP, filed on Jan. 31, 2005, currently pending, which is hereby incorporated herein by reference in its entirety.

FIELD OF THE INVENTION

The present invention relates to a phase locked loop (PLL) providing phase or frequency modulation and more particularly relates to a linearization system for a Fractional-N Offset PLL (FN-OPLL) providing phase or frequency modulation.

BACKGROUND OF THE INVENTION

Due to load pulling, power supply pushing, and radio frequency (RF) re-modulation effects in a narrow bandwidth phase locked loop (PLL), such as a fractional-N PLL, it is desirable to use a wide bandwidth PLL in some applications. In addition, when using the PLL for direct digital modulation as described in commonly owned and assigned U.S. Pat. No. 6,834,084, entitled DIRECT DIGITAL POLAR MODULATOR, issued Dec. 21, 2004, which is incorporated herein by reference in its entirety, narrow band PLLs may require pre-distortion and calibration. A typical wide bandwidth PLL is an Offset PLL (OPLL). However, OPLLs require an I/Q modulator in order to generate either a reference frequency provided to a phase detector of the OPLL or a feedback signal provided to the phase detector. The I/Q modulator requires careful design and an analog interface. However, in many applications, it is desirable to have a digital interface. Accordingly, there remains a need for a less complex wide bandwidth PLL having a digital interface.

SUMMARY OF THE INVENTION

The present invention provides a linearization system for a Fractional-N Offset Phase Locked Loop (FN-OPLL) in a frequency or phase modulation system. In general, the linearization system processes a modulation signal to provide a linearized modulation signal to a fractional-N divider in a reference path of the FN-OPLL such that a frequency or phase modulation component at the output of the FN-OPLL has a substantially linear relationship to the frequency or phase modulation component of the modulation signal.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
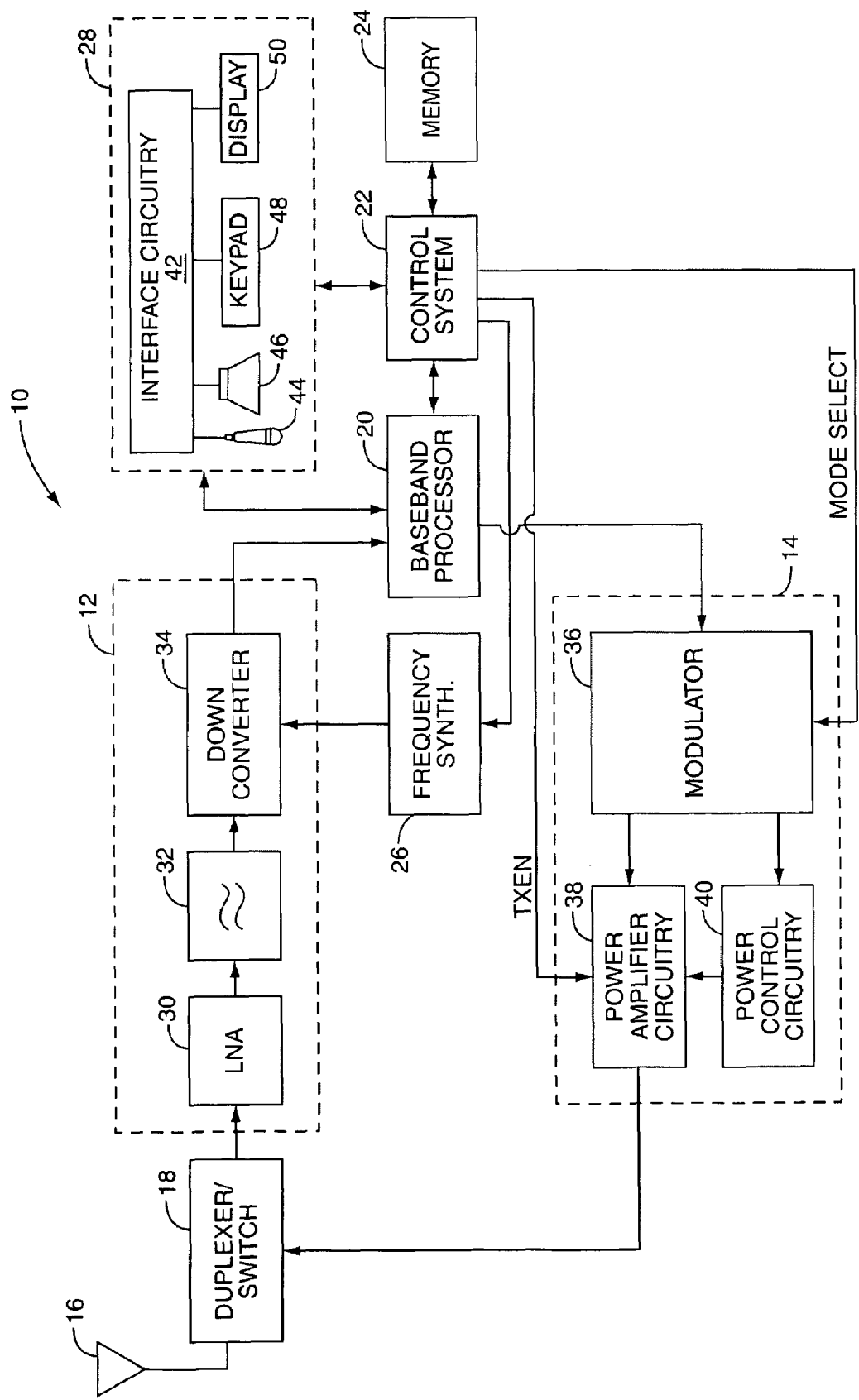
FIG. 1 illustrates a mobile terminal according to one embodiment of the present invention.

The present invention is preferably incorporated in a mobile terminal 10, such as a mobile telephone, personal digital assistant, wireless Local Area Network (LAN) device, a base station in a mobile network, or the like. The basic architecture of a mobile terminal 10 is represented in FIG. 1, and may include a receiver front end 12, a radio frequency transmitter section 14, an antenna 16, a duplexer or switch 18, a baseband processor 20, a control system 22, memory 24, a frequency synthesizer 26, and an interface 28. The receiver front end 12 receives information bearing radio frequency signals from one or more remote transmitters provided by a base station (not shown). A low noise amplifier 30 amplifies the signal. A filter circuit 32 minimizes broadband interference in the received signal, while a downconverter 34 downconverts the filtered, received signal to an intermediate or baseband frequency signal, which is then digitized into one or more digital streams. The receiver front end 12 typically uses one or more mixing frequencies generated by the frequency synthesizer 26.

The baseband processor 20 processes the digitized, received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The control system 22 may run software stored in the memory 24. Alternatively, the operation of the control system 22 may be a function of sequential logic structures as is well understood. After encoding the data from the control system 22, the baseband processor 20 outputs the encoded data to the radio frequency transmitter section 14. A modulator 36 receives the data from the baseband processor 20 and operates according to one or more modulation schemes to provide a modulated signal to the power amplifier circuitry 38. The modulation scheme of the modulator 36 is controlled by a mode select signal (MODE SELECT) from the control system 22.

In one embodiment, the modulator 36 operates according to either an 8-Level Phase Shift Keying (8PSK) modulation scheme, which is a modulation scheme containing both amplitude and phase components, or a Gaussian Minimum Shift Keying (GMSK) modulation scheme, which is a constant amplitude modulation scheme. When in 8PSK mode, the modulator 36 provides a phase modulation component at a desired transmit frequency to the power amplifier circuitry 38 and an amplitude modulation component to the power control circuitry 40. The power control circuitry 40 controls an output power of the power amplifier circuitry 38 based on the amplitude modulation component or, optionally, a combination of a ramping signal and the amplitude modulation component, thereby providing amplitude modulation of the phase modulation component. When in GMSK mode, the modulator 36 provides a phase modulated signal to the power amplifier circuitry 38 and the ramping signal to the power control circuitry 40, where the power control circuitry 40 controls the output power of the power amplifier circuitry 38 based on the ramping signal.

The power amplifier circuitry 38 amplifies the modulated signal from the modulator 36 to a level appropriate for transmission from the antenna 16. A gain of the power amplifier circuitry 38 is controlled by the power control circuitry 40. In essence, the power control circuitry 40 operates to control a supply voltage provided to the power amplifier circuitry 38. When in 8PSK mode, the power control circuitry 40 controls the supply voltage based on the amplitude modulation component or, optionally, a combination of the amplitude modulation component and the ramping signal from the modulator 36. When in GMSK mode, the power control circuitry 40 operates to control the supply voltage provided to the power amplifier circuitry 38 based on the ramping signal.

A user may interact with the mobile terminal 10 via the interface 28, which may include interface circuitry 42 associated with a microphone 44, a speaker 46, a keypad 48, and a display 50. The interface circuitry 42 typically includes analog-to-digital converters, digital-to-analog converters, amplifiers, and the like. Additionally, it may include a voice encoder/decoder, in which case it may communicate directly with the baseband processor 20.

The microphone 44 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 46 by the interface circuitry 42. The keypad 48 and display 50 enable the user to interact with the mobile terminal 10, input numbers to be dialed and address book information, or the like, as well as monitor call progress information.

Figure 2:
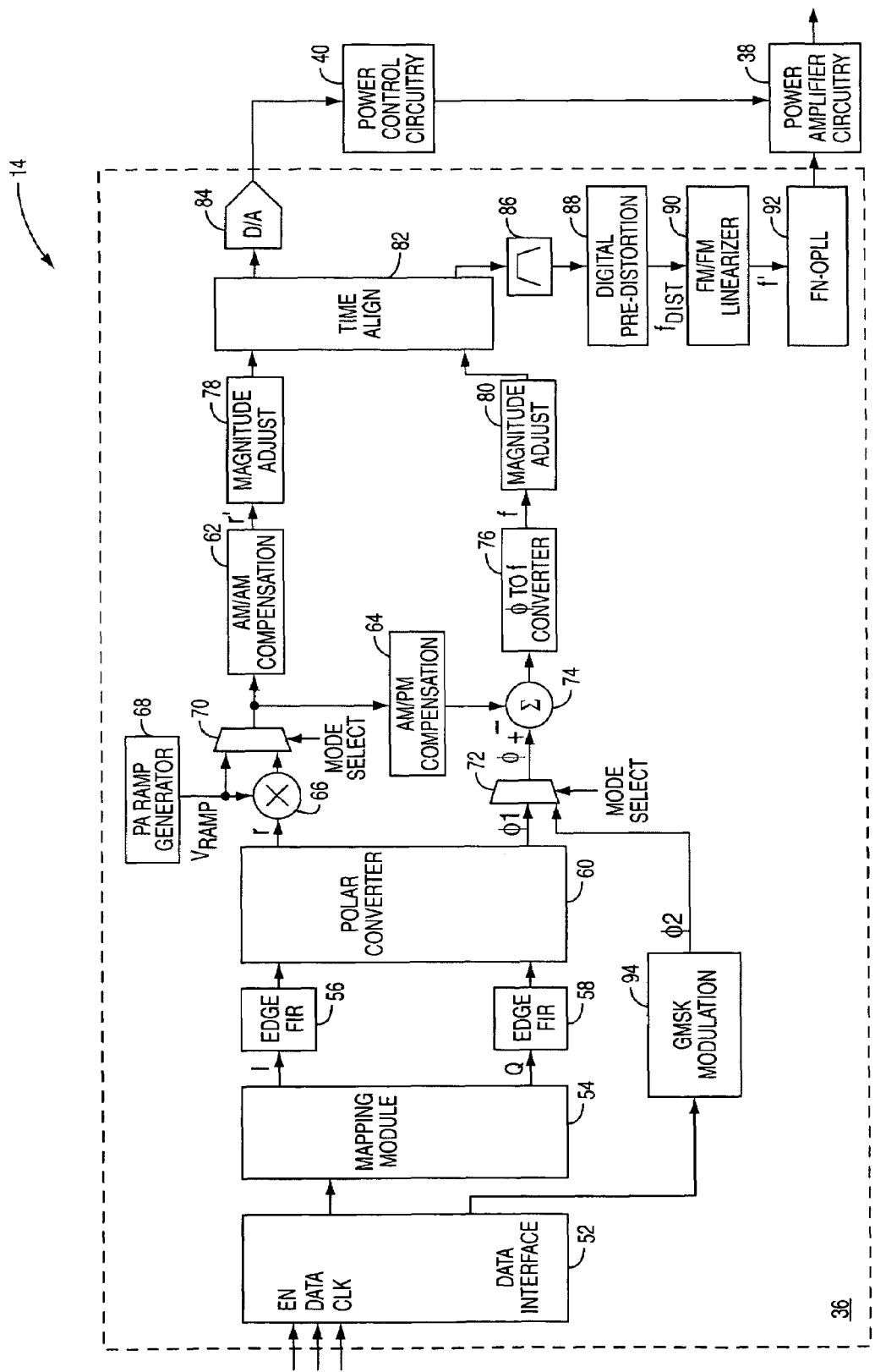
FIG. 2 is a more detailed illustration of the modulator of the mobile terminal of FIG. 1 including digital pre-distortion circuitry for pre-distorting a modulation signal provided to a fractional-N divider in a reference path of a phase locked loop (PLL) according to one embodiment of the present invention.

FIG. 2 illustrates an exemplary embodiment of the modulator 36 wherein the modulator 36 operates in either an 8PSK mode or a GMSK mode. It should be noted 8PSK and GMSK are exemplary modulation schemes and are not intended to limit the scope of the present invention. As illustrated, the modulator 36 includes several components, including a data interface 52, a mapping module 54, first and second filters 56, 58, and a polar converter 60. Other components of the modulator 36 will be discussed below. It should be noted that the data interface 52 may include First In First Out (FIFO) circuitry or may alternatively be a real time serial data interface.

The mapping module 54, the filters 56 and 58, and the polar converter 60 form part of an 8PSK modulator. As discussed below, the 8PSK modulator also includes amplitude modulation to amplitude modulation (AM/AM) compensation circuitry 62, amplitude modulation to phase modulation (AM/PM) compensation circuitry 64, and various other components.

When in 8PSK mode, the data interface 52 receives data from the baseband processor 20 (FIG. 1) at the bit rate of the system. This data is passed to the mapping module 54, where the data is grouped into symbols of three consecutive data bits, Grey coded, and rotated by $3\pi/8$ on each symbol as per European Telecommunications Standards Institute (ETSI) specifications. The resulting symbol is mapped to one of sixteen points in an in-phase (I), quadrature phase (Q) constellation.

Both the in-phase (I) and the quadrature phase (Q) components for each point are then filtered by the first and second filters 56, 58, respectively. In an exemplary embodiment, the first and second filters 56, 58 are Enhanced Data Rates for GSM Evolution (EDGE) finite impulse response (FIR) filters. This, as dictated by the ETSI specifications, shapes the response between symbol times.

After filtering, both the in-phase (I) and the quadrature phase (Q) components are sent to the polar converter 60. The polar converter 60 uses a classical coordinate rotation digital computer (CORDIC) algorithm or like rectangular to polar conversion technique. Thus, the polar converter 60 generates phase ($\phi$) and amplitude (r) equivalent signals. Further information about CORDIC algorithms may be found in *Proceedings of the 1998 ACM/SIGDA Sixth International Symposium On Field Programmable Gate Arrays* by Ray Andraka, February 22-24, pp. 191-200 and "The CORDIC Trigonometric Computing Technique" by Jack E. Volder, *IRE Trans on Elect. Computers,* p. 330, 1959, both of which are hereby incorporated by reference in their entireties.

The amplitude signal (r) from the polar converter 60 is provided to a first input of a multiplier 66. A power amplifier (PA) ramp generator 68 generates a ramping signal ($V_{RAMP}$) and provides the ramping signal ($V_{RAMP}$) to a second input of the multiplier 66. The ramping signal ($V_{RAMP}$) is generated to define the transmit burst. A magnitude of the ramping signal ($V_{RAMP}$) may be controlled to control an output power level of the power amplifier circuitry 38. The multiplier 66 operates to multiply the amplitude signal (r) and the ramping signal ($V_{RAMP}$) to provide an output signal. The output signal from the multiplier 66 and the ramping signal ($V_{RAMP}$) are provided to a switch 70, which is controlled by the mode select signal (MODE SELECT). In 8PSK mode, the switch 70 is controlled such that the output of the multiplier 66 is output by the switch 70.

At this point, the amplitude signal from the output of the switch 70 is split and directed to the AM/AM compensation circuitry 62 and the AM/PM compensation circuitry 64. The AM/AM compensation circuitry 62 introduces a compensation term to the amplitude signal that, after further processing, counteracts the distortion introduced by AM to AM conversion in the power amplifier circuitry 38. Further details of an exemplary embodiment of the AM/AM compensation circuitry 62 can be found in commonly owned and assigned U.S. Patent Application Publication No. 2003/0215026, entitled AM TO AM CORRECTION SYSTEM FOR POLAR MODULATOR, filed May 16, 2002, which is hereby incorporated by reference in its entirety.

The phase signal ($\phi 1$) from the polar converter 60 is directed to a switch 72, which is controlled by the mode select signal (MODE SELECT). In 8PSK mode, the switch 72 is controlled to output the phase signal ($\phi 1$) as a phase signal ($\phi$). The AM/PM compensation circuitry 64 introduces a compensation term to the phase signal ($\phi$) via subtraction circuitry 74 that, after further processing, counteracts the distortion introduced by AM to PM conversion in the power amplifier circuitry 38. Further details of an exemplary embodiment of the AM/PM compensation circuitry 64 can be found in commonly owned and assigned U.S. Patent Application Publication No. 2003/0215025, entitled AM TO PM CORRECTION SYSTEM FOR POLAR MODULATOR, filed May 16, 2002, which is hereby incorporated by reference in its entirety.

The output of the subtraction circuitry 74, which is referred to herein as a combined signal, is directed to a phase to frequency converter 76. The output of the phase to frequency converter 76 is a frequency signal (f), which generally corresponds to the desired frequency deviation of the modulated signal. Magnitude adjusters 78, 80 then adjust the magnitude of the pre-distorted amplitude signal (r') and the frequency signal (f), respectively, to a level expected by a time aligner 82, such that they comply with the appropriate standard. Next, a relative time delay is applied as necessary to the signals for best Error Vector Magnitude (EVM) and spectrum by the time aligner 82, such that the time aligner 82 provides the time-aligned, predistorted amplitude signal (r') and frequency signal (f). Because these are preferably digital components, concerns about variations in analog components and the corresponding variation in time delays downstream are minimized.

At this point, the amplitude signal and the frequency signal separate and proceed by different paths, an amplitude signal processing path and a frequency signal processing path, to the power amplifier circuitry 38. With respect to the amplitude signal processing path, when in the 8PSK mode, the time-aligned, pre-distorted amplitude signal (r'), which may be referred to as a digital power control signal, is converted to an analog power control signal by a digital-to-analog (D/A) converter 84. The analog power control signal is used by the power control circuitry 40 to set the collector voltage on the power amplifier circuitry 38. As the analog power control signal changes, the voltage at the power amplifier circuitry 38 collector changes, and the output power will vary as $V^2/R_{out}$ ($R_{out}$ is not shown, but is effectively the load on the power amplifier circuitry 38). This is sometimes known as "plate modulation."

The time-aligned frequency signal (f) from the time aligner 82 is directed to a digital filter 86, digital pre-distortion circuitry 88, and linearizer 90 to provide a linearized frequency signal (f') to a Fractional-N Phase Locked Loop (FN-OPLL) 92. Due to the closed loop frequency response or transfer function of the FN-OPLL 92, which is basically a low-pass response, the FN-OPLL 92 has an upper limit for permissible modulation rates. As discussed below, the pre-distortion applied by the digital pre-distortion circuitry 88 operates to extend the allowable range of modulation rates that may be passed through the FN-OPLL 92. More specifically, the pre-distortion applied by the digital pre-distortion circuitry 88 is such that the convolution, or cascade, of the pre-distortion and the transfer function of the FN-OPLL 92 results in a substantially flat frequency response in amplitude, phase, and group delay for a range of modulation rates greater than the range of modulation rates that would be permissible for the FN-OPLL 92 without the digital pre-distortion circuitry 88. It should be noted that the digital pre-distortion circuitry 88 is optional and not necessary for the present invention.

According to the present invention, the linearizer 90 operates to linearize the FN-OPLL 92. As discussed below, if the linearizer 90 is not present, the output of the FN-OPLL 92 is generally non-linear with respect to the pre-distorted frequency signal ($f_{DIST}$). This non-linearity is referred to herein as Frequency Modulation to Frequency Modulation (FM/FM) distortion. The linearizer 90 operates to compensate for the FM/FM distortion. More specifically, the linearizer 90 operates on the pre-distorted frequency signal ($f_{DIST}$) to provide a linearized frequency signal (f') such that the output of the FN-OPLL 92 is substantially linear with respect to the pre-distorted frequency signal ($f_{DIST}$). In other words, the linearizer 90 operates such that a frequency or phase modulation component of the output of the FN-OPLL 92 is substantially linear with respect to the pre-distorted frequency signal ($f_{DIST}$).

After the frequency signal (f) is pre-distorted and linearized, the pre-linearized frequency signal (f'), which is a digital signal, is provided to the FN-OPLL 92 to provide direct digital modulation in a manner similar to that described in commonly owned and assigned U.S. Pat. No. 6,834,084. The FN-OPLL 92 generates an output at the desired radio frequency. In one embodiment, the data interface 52 provides a digital data interface to the baseband processor 20 (FIG. 1), and the entire phase path from the data interface 52 to the FN-OPLL 92 is a digital path.

The modulator 36 also includes a GMSK modulator, which includes the GMSK modulation circuitry 94. When in GMSK mode, the GMSK modulation circuitry 94 processes the data to generate a phase signal (φ2). In one embodiment, the GMSK modulation circuitry 94 is a look-up table. Another exemplary embodiment of the GMSK modulation circuitry 94 is discussed in U.S. Pat. No. 5,825,257, entitled GMSK MODULATOR FORMED OF PLL TO WHICH CONTINUOUS PHASE MODULATED SIGNAL IS APPLIED, issued Oct. 20, 1998, which is hereby incorporated by reference in its entirety. It should be appreciated that other embodiments of the GMSK modulation circuitry 94 may also be used and the particular circuitry is not central to the present invention.

The phase signal (φ2) from the GMSK modulation circuitry 94 is provided to the switch 72. In GMSK mode, the switch 72 is controlled to output the phase signal (φ2) from the GMSK modulation circuitry 94. As discussed above, the phase signal (φ) output by the switch 72 is pre-distorted via AM/PM compensation circuitry 64 and the subtraction circuitry 74, converted to the frequency signal (f) via the phase-to-frequency converter 76, and adjusted and time-aligned via the magnitude adjuster 80 and time aligner 82.

As for the amplitude signal, the switch 70 is controlled such that the ramping signal ($V_{RAMP}$), rather than the output of the multiplier 66, is provided to the AM/AM compensation circuitry 62 and the AM/PM compensation circuitry 64. As such, the output of the switch 70 has no amplitude modulation component, as is desired for GMSK mode. As discussed above, the pre-distorted amplitude signal (r') from the AM/AM compensation circuitry 62 is magnitude adjusted and time aligned by the magnitude adjuster 78 and time aligner 82.

At this point, the amplitude signal and the frequency signal output by the time aligner 82 separate and proceed by different paths to the power amplifier circuitry 38. With respect to the amplitude signal processing path, the time-aligned, pre-distorted amplitude signal (r'), which may be referred to as a digital power control signal, is converted to an analog power control signal by the D/A converter 84. The analog power control signal is used by the power control circuitry 40 to set the collector voltage on the power amplifier circuitry 38. As with 8PSK mode, the frequency signal (f) from the time aligner 82 is directed to the digital filter 86, the digital pre-distortion circuitry 88, the linearizer 90, and the FN-OPLL 92. The FN-OPLL 92 generates the output at the desired radio frequency.

Figure 3:
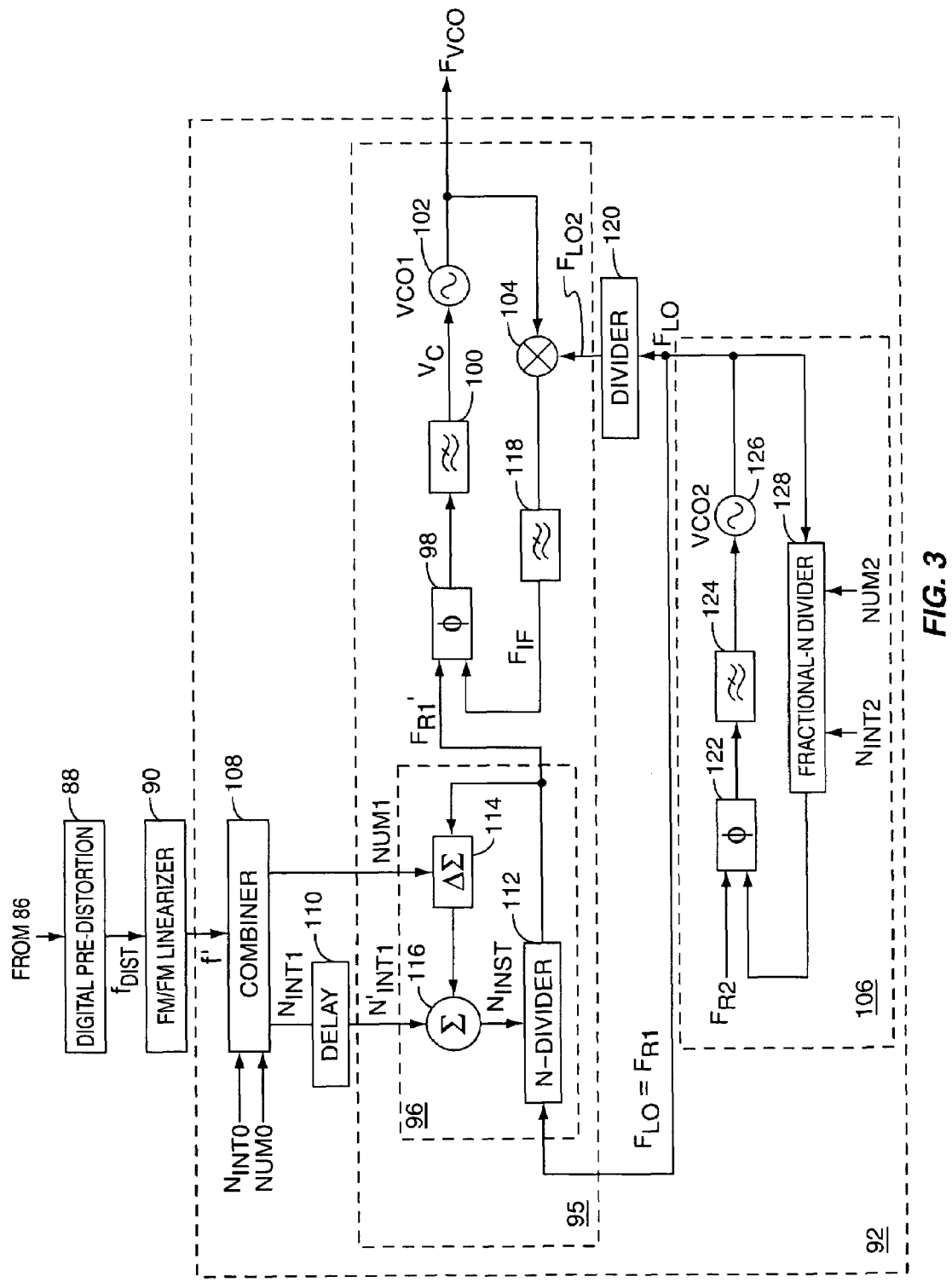
FIG. 3 illustrates an exemplary embodiment of the PLL according to one embodiment of the present invention.

FIG. 3 illustrates a first embodiment of the present invention wherein the linearizer 90 provides the linearized frequency signal (f') to a fractional-N divider in the reference path of the FN-OPLL 92. In general, the FN-OPLL 92 includes a first phase lock loop (PLL) 95, which includes a fractional-N divider 96, a phase detector 98, a loop filter 100, a voltage controlled oscillator (VCO) 102, and a mixer 104.

The FN-OPLL 92 also includes a second PLL 106. It should be noted that the second PLL 106 may also be used as the frequency synthesizer 26 (FIG. 1) for the mobile terminal 10 when in receive mode. In operation, the fractional-N divider 96 fractionally divides a local oscillator frequency signal ($F_{LO}$), which is the output of the second PLL 106 and a reference frequency ($F_{R1}$) for the first PLL 95, based on an integer value ($N_{INT1}$) and fractional value (NUM1) to provide reference signal ($F_{R1}'$).

The values $N_{INT1}$ and NUM1 are generated by combiner circuitry 108 based on a modulation signal, which in this embodiment corresponds to the linearized frequency signal (f') from the phase path of the modulator 36 of FIG. 2, and integer and fractional values $N_{INT0}$ and NUM0. The integer and fractional values $N_{INT0}$ and NUM0 define an initial fractional divide value ($N_0$), which corresponds to a desired center or carrier frequency of the output signal ($F_{VCO}$). The integer and fractional values $N_{INT0}$ and NUM0 may be provided by the control system 22 (FIG. 1).

In one embodiment, the combiner circuitry 108 combines the initial fractional divide value ($N_0$) and the linearized frequency signal (f') using the following equation:

$$N = N_0 + \text{Modulation, where}$$

$$N = N_{INT1}.\text{NUM1, and}$$

N is a combined divider value and "Modulation" is the linearized frequency signal (f'). The value $N_{INT1}$ is an integer portion of the combined divider value and NUM1 is a fractional part of the combined divider value.

The value $N_{INT1}$ is passed to delay circuitry 110 which delays the value $N_{INT1}$ with a delay equal to the effective delay of delta-sigma modulator 114, creating a delayed version of the value $N_{INT1}$ ($N'_{INT1}$). As discussed below, the delay ensures that the value $N'_{INT1}$ and a sequence output by the delta-sigma modulator 114 are time aligned at a summation node of the fractional-N divider 96.

An exemplary embodiment of the fractional-N divider 96 is also illustrated in FIG. 3, wherein the fractional-N divider 96 includes N-divider circuitry 112, delta-sigma modulator 114, and summation circuitry 116. The summation circuitry 116 is generally referred to as combiner circuitry, and can comprise, for example, a digital binary adder. The operation of the fractional-N divider 96 is known in the art and is not described in detail herein. In general, the fractional-N divider 96 divides the local oscillator signal ($F_{LO}$), or reference signal, by $N'_{INT1}.\text{NUM1}$, where $N'_{INT1}$ is the delayed version of the integer portion ($N_{INT1}$) of the combined divide value from the combiner circuitry 108 and NUM1 is the fractional portion of the combined divide value from the combiner circuitry 108. The delay circuitry 110 ensures that the delayed version of the value $N_{INT1}$ ($N'_{INT1}$) and the sequence output by the delta-sigma modulator 114 are time aligned at the summation circuitry 116. Accordingly, an instantaneous divide value ($N_{INST}$) provided to the N-divider circuitry 112 from the summation circuitry 116 is defined as:

$$N_{INST} = N'_{INT1} + \text{sequence,}$$

where $N'_{INT1}$ is the output of the delay circuitry 110, and "sequence" is a current value of a sequence provided by the delta-sigma modulator 114, as will be apparent to one of ordinary skill in the art.

Since the fractional divide value ($N'_{INT1}.\text{NUM1}$) of the fractional-N divider 96 is provided by the combiner circuitry 108 based on the pre-distorted frequency signal (f'), the local oscillator signal ($F_{LO}$) is fractionally divided based on the pre-distorted frequency signal (f'), thereby controlling the output signal ($F_{VCO}$) of the FN-OPLL 92 such that it is a phase or frequency modulated signal. Further, in one embodiment, the pre-distorted frequency signal (f') is a digital signal such that the FN-OPLL 92 provides a digital modulation interface. This is especially beneficial where the phase path of the modulator 36 (FIG. 2) from the data interface 52 (FIG. 2) to the FN-OPLL 92 is entirely a digital path according to one embodiment of the present invention.

The phase detector 98 compares the fractionally divided reference signal ($F_{R1}'$) output by the fractional-N divider 96 to an intermediate frequency signal ($F_{IF}$). The output of the phase detector 98 is filtered by the loop filter 100 and provided to the VCO 102 as a control voltage ($V_C$). The loop filter 100 is designed such that the first PLL 95 has a wide open-loop unity-gain bandwidth. In one embodiment, the first PLL 95 has a bandwidth of 800 kHz. The wide bandwidth is possible, at least in part, due to the use of the mixer 104 in the feedback path rather than a fractional-N divider as in traditional fractional-N PLLs. Based on the control voltage ($V_C$), the VCO 102 provides the output signal ($F_{VCO}$). As described above with respect to the modulator 36, the output of the VCO 102 is the modulated signal and is provided to the power amplifier circuitry 38 (FIG. 2).

The output signal ($F_{VCO}$) of the VCO 102 is also provided to a feedback path including the mixer 104 and optionally a feedback filter 118. The mixer 104 operates to multiply the output signal ($F_{VCO}$) of the VCO 102 by a divided local oscillator signal ($F_{LO2}$). It should be noted that additional divider circuits may be placed between the VCO 102 and the mixer 104 depending on the particular implementation. The divided local oscillator signal ($F_{LO2}$) is provided by a divider 120, which operates to divide the local oscillator signal ($F_{LO}$) from the second PLL 106 by an integer divide value. The divider 120 may alternatively be a fractional-N divider. It should be noted that the divider 120 is optional, and the local oscillator signal ($F_{LO}$) may alternatively be provided to the mixer 104.

In operation, the mixer 104 multiplies the output signal ($F_{VCO}$) of the VCO 102 and the divided local oscillator signal ($F_{LO2}$), thereby downconverting the output signal ($F_{VCO}$) to provide the intermediate frequency signal ($F_{IF}$). The output of the mixer 104 may include a high frequency component at a frequency equal to the frequency of the signal ($F_{VCO}$) plus the frequency of the divided local oscillator signal ($F_{LO2}$) and a low frequency component at a frequency equal to a difference of the frequency of the signal ($F_{VCO}$) and the frequency of the divided local oscillator signal ($F_{LO2}$), as commonly known. Thus, the output of the mixer 104 may optionally be filtered by the feedback filter 118 to remove either the high frequency component or the low frequency component depending on the particular implementation to thereby provide the intermediate frequency signal ($F_{IF}$) to the phase detector 98.

An exemplary embodiment of the second PLL 106 is also illustrated in FIG. 3. In this embodiment, the second PLL 106 is a fractional-N PLL and includes a phase detector 122, a loop filter 124, a voltage controlled oscillator (VCO2) 126, and a fractional-N divider 128. In operation, the voltage controlled oscillator 126 provides the local oscillator signal ($F_{LO}$). The local oscillator signal ($F_{LO}$) is fractionally divided by the fractional-N divider 128 to provide a feedback signal to one input of the phase detector 122. A reference frequency ($F_{R2}$), which may be generated by a reference oscillator, is provided to a second input of the phase detector 122. The phase detector 122 compares the feedback signal to the reference frequency ($F_{R2}$) and an output signal from the phase detector 122 is provided to the loop filter 124. The loop filter 124 filters the output signal from the phase detector 122 to provide a control voltage to the voltage controlled oscillator 126. In one embodiment, the loop filter 124 has a narrow bandwidth, such as 90 kHz. The frequency of the local oscillator signal ($F_{LO}$) is controlled by an external component, such as the control system 22 (FIG. 1), by controlling the control inputs ($N_{INT2}$ and NUM2) provided to the fractional-N divider 128. Accordingly, the control inputs $N_{INT2}$ and NUM2 may be controlled for channel selection and for spur avoidance.

Digital Pre-Distortion

The digital pre-distortion circuitry 88 operates to pre-distort the frequency signal (f) to provide the pre-distorted frequency signal ($f_{DIST}$). As discussed above, the pre-distorted frequency signal ($f_{DIST}$) is processed by the linearizer 90 to provide the linearized frequency signal (f'), which is provided to the fractional-N divider 96 via the combiner 108. Note that the frequency signal (f) may also be referred to as a modulation signal, and the pre-distorted frequency signal ($f_{DIST}$) may also be referred to as a pre-distorted modulation signal.

In general, the digital pre-distortion circuitry 88 operates to apply pre-distortion in order to effectively increase the bandwidth of the FN-OPLL 92 with respect to the frequency signal (f). More specifically, the digital pre-distortion circuitry 88 pre-distorts the frequency signal (f) such that the convolution, or cascade, of the pre-distortion and a transfer function of the FN-OPLL 92 results in a substantially flat frequency response in amplitude, phase, and group delay with respect to the frequency signal (f) for a range of modulation rates greater than the bandwidth of the FN-OPLL 92.

Using a time domain analysis, the operation of the digital pre-distortion circuitry 88 may be described using the following mathematical analysis. First, a desired modulation shaping g(t) may be defined as:

$$g(t) = h(t) * g_{pd}(t),$$

where "*" denotes convolution, h(t) is an impulse response of the FN-OPLL 92, and $g_{pd}(t)$ is the pre-distorted modulation shaping. Note that the impulse response h(t) is the inverse LaPlace transform of a transfer function, H(s), of the FN-OPLL 92. In the frequency domain, $$G(s) = H(s) \cdot G_{pd}(s).$$

Therefore, $$G_{pd}(s) = \frac{G(s)}{H(s)}.$$

Solving for the pre-distorted modulation shaping $g_{pd}(t)$ then yields, $$g_{pd}(t) = \int_0^\infty g(t-u) Laplace^{-1}\{1/H(s), u\} du.$$

Using this equation, the digital pre-distortion circuitry 88 may be implemented such that it computes the pre-distorted modulation shaping $g_{pd}(t)$ based on the modulation shaping signal g(t). Alternatively, the digital pre-distortion circuitry 88 may be implemented as a look-up table (LUT), wherein the desired values of the pre-distorted modulation signal are pre-computed based on the pre-distorted modulation shaping $g_{pd}(t)$ and stored in the LUT.

As an example, the desired modulation shaping may be that of the GMSK modulation scheme of the Global System for Mobile Communications (GSM) standard and may be defined as:

$$h_{mod}(t) = \frac{e^{-\frac{t^2}{2\delta^2 T^2}}}{\sqrt{2\pi} \, \delta T},$$

$$g(t) = \int_{t-\frac{T}{2}}^{t+\frac{T}{2}} \frac{h_{mod}(x)}{\varsigma_T} dx, \text{ where}$$

$$T = \frac{48}{13 \cdot 10^6},$$

$$\delta = \frac{\sqrt{\ln(2)}}{2\pi BT}, \text{ and}$$

$$BT = 0.3.$$

Further, an exemplary transfer function, H(s), of the FN-OPLL 92 may be defined as:

$$H(s) = \frac{K_V \cdot K_\phi (s + \omega_z)}{N \cdot C2 \cdot s^3 + N \cdot C2 \cdot \omega_P \cdot s^2 + K_V \cdot K_\phi \cdot s + K_V \cdot K_\phi \cdot \omega_z}, \text{ where}$$

$$K_V = 25 \cdot 10^6,$$

$$K_\phi = 10^3,$$

$$N = 1,$$

$$\omega_Z = \frac{\omega_0}{3},$$

$$\omega_P = 3\omega_0,$$

$$\omega_0 = 2 \cdot \pi \cdot 150 \cdot 10^3, \text{ and}$$

$$C2 = \frac{3 \cdot K_V \cdot K_\phi}{N \cdot \omega_P^2}.$$

$K_v$ is the sensitivity of the VCO 102, $K_\phi$ is the magnitude of the phase detector 98, N is the divide value in the feedback path which is 1 for the first PLL 95, and $\omega_0$ is the frequency of oscillation of the VCO 102. Using the equation for $g_{pd}(t)$ given above, $$g_{pd}(t) = \int_0^{10^{-4}} g(t-u) \cdot htf(u) du + \frac{19}{27} \cdot g(t) + \frac{1}{337500\pi} \cdot g(t-1) + \frac{1}{2.7 \cdot 10^{11} \cdot \pi^2} \cdot g(t-2).$$

Note that the upper limit of the convolution integral has been reduced from infinity to $10^{-4}$. This is possible by noting that the overlap of the two functions has become zero by this point and thus integrating further will only increase the solution time.

Using the equation for the pre-distorted modulation shaping, a look-up table may be generated and used to provide the pre-distorted modulation signal based on the modulation signal. For example, for GMSK, the pre-distorted modulation shaping, which is a distorted Gaussian curve, may be divided into a number of segments. In this example, there are eighty segments. Further, at any instant of time, there are five input pulses to the digital pre-distortion circuitry 88, each being offset in time by one symbol time, that contribute to the total response. Thus, when a pulse first comes into the digital pre-distortion circuitry 88, it is at the near zero tail part of the pre-distorted modulation shaping; after 16 clock times, it is ⅕ through the pre-distorted modulation shaping; at 40 clock times, it is halfway through and is at it maximum; at 48 clock times, it is ⅗ of the way through; at 64 clock times, it is ⅘ of the way through; and at 80 clock times, it is back to zero on the other side of the pre-distorted modulation shaping. As this input pulse is traveling through the system, there are four others with n*16 clock offsets from this. The input pulses are multiplied by +1 or −1, and all five are summed to give the overall response or output of the digital pre-distortion circuitry 88. As a result, the LUT may be derived by computing the desired output for all 32 possible combinations of +1 and −1 for the five pulses based on the equation for the pre-distorted modulation shaping defined above.

In another embodiment, the operation of the digital pre-distortion circuitry 88 may be described using a frequency domain analysis. Using the frequency domain analysis, it is shown that the digital pre-distortion circuitry 88 may be implemented as a digital filter that causes the modulation signal to be pre-distorted as described above in the time domain analysis. In essence, a transfer function of the digital pre-distortion circuitry 88 is selected to be substantially the inverse of the transfer function of the FN-OPLL 92. As an example, the transfer function of the FN-OPLL 92 may be:

$$H(s) = \frac{1 + C_{f1} \cdot s}{C_{f6} \cdot s^6 + C_{f5} \cdot s^5 + C_{f4} \cdot s^4 + C_{f3} \cdot s^3 + C_{f2} \cdot s^2 + C_{f1} \cdot s + 1}.$$

As such, the transfer function of the digital pre-distortion circuitry 88 may be defined as:

$$G_{pd}(s) = \frac{1}{H(s)} = \frac{C_{f6} \cdot s^6 + C_{f5} \cdot s^5 + C_{f4} \cdot s^4 + C_{f3} \cdot s^3 + C_{f2} \cdot s^2 + C_{f1} \cdot s + 1}{1 + C_{f1} \cdot s}.$$

In order to improve stability, a number of poles may be added to the transfer function, $G_{pd}(s)$, of the digital pre-distortion circuitry 88. For example, the digital pre-distortion circuitry 88 may be implemented as a digital filter having the transfer function:

$$G_{pd}(s) = \frac{C_{f6} \cdot s^6 + C_{f5} \cdot s^5 + C_{f4} \cdot s^4 + C_{f3} \cdot s^3 + C_{f2} \cdot s^2 + C_{f1} \cdot s + 1}{(1 + C_{f1} \cdot s) \cdot (1 + s \cdot R1 \cdot C1) \cdot (1 + s \cdot R2 \cdot C2) \cdot (1 + s \cdot R3 \cdot C3) \cdot (1 + s \cdot R4 \cdot C4) \cdot (1 + s \cdot R5 \cdot C5)}$$

where R1-R5 and C1-C5 define a number of poles that improve the stability of the digital filter. The values of R1-R5 and C1-C5 may vary depending on the particular implementation.

Linearization

In general, assuming high side local oscillator injection, the output of the FN-OPLL 92 may be defined as:

$$F_{VCO} = F_{R1}\left(N_2 - \frac{N_2}{N_1}\right),\quad \text{Equation (1)}$$

where $N_1$ is $N_{INT1}$.NUM1 and $N_2$ is $N_{INT2}$.NUM2. In order to illustrate the modulation, for high-side local oscillator injection, the output of the FN-OPLL 92 may be rewritten as:

$$F_{VCO} = F_{R1}\left(N_2 - \frac{N_2}{N_0 + \Delta N_{FN-OPLL}}\right),\quad \text{Equation (2)}$$

where $\Delta N_{FN\text{-}OPLL}$ is the modulation signal applied to the combiner circuitry 108, which in FIG. 2 is the linearized frequency signal (f') from the linearizer 90 $N_0$ is $N_{INT0}$.NUM0 and is the input to the combiner circuitry 108, which selects the desired center frequency. From Equation (2), it is apparent that the output of the FN-OPLL 92 is non-linear with respect to the modulation signal applied to the input of the combiner circuitry 108. As such, if the linearizer 90 were not present, the FN-OPLL 92 would be non-linear with respect to the pre-distorted frequency signal ($f_{DIST}$).

The linearizer 90 of the present invention operates to compensate for the non-linearity of the FN-OPLL 92. More specifically, the linearizer 90 processes the pre-distorted frequency signal ($f_{DIST}$) to provide the linearized frequency signal (f') such that the output of the FN-OPLL 92 is substantially linear with respect to the pre-distorted frequency signal ($f_{DIST}$). The linearized frequency signal (f') may also be referred to herein as a linearized modulation signal.

Figure 4:
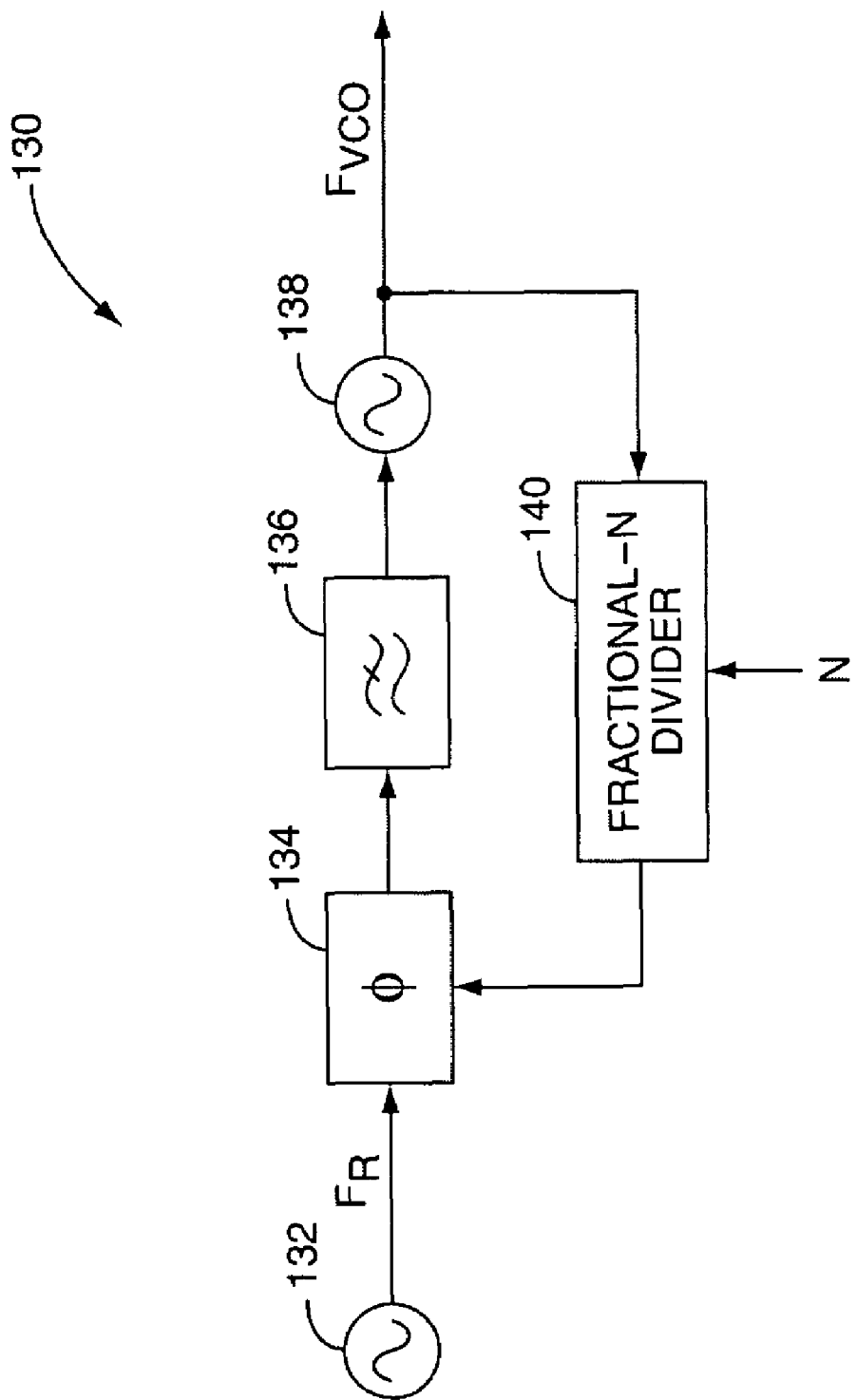
FIG. 4 illustrates a typical fractional-N PLL.

In the preferred embodiment, the linearizer 90 operates based on equating the expression for the output of the FN-OPLL 92 with the expression for the output of a traditional fractional-N PLL. A traditional fractional-N PLL 130 is illustrated in FIG. 4. The fractional-N PLL 130 includes a reference oscillator 132, a phase detector 134, a loop filter 136, a VCO 138, and a fractional-N divider 140. The output of the fractional-N PLL 130 may be defined as:

$$F_{VCO} = F_R N.\quad \text{Equation (3)}$$

Note that the output of the fractional-N PLL 130 is linear with respect to the divide value (N). If a modulation signal is also applied to the fractional-N divider 140 in a manner similar to that described above with respect to the FN-OPLL 92, the output of the fractional-N PLL 130 may be defined as:

$$F_{VCO} = F_R(N + \Delta N_{PLL}),\quad \text{Equation (4)}$$

where $\Delta N_{PLL}$ is the modulation signal applied to the fractional-N PLL 130.

Returning to FIG. 3, since the desired output frequency or phase modulation deviation and the center frequency for the FN-OPLL 92 is identical to the output frequency or phase modulation deviation and the center frequency for the fractional-N PLL 130 implementation, Equations (2) and (4) above may be equated to provide:

$$F_R(N + \Delta N_{PLL}) = F_{R1}\left(N_2 - \frac{N_2}{N_0 + \Delta N_{FN\text{-}OPLL}}\right). \quad \text{Equation (5)}$$

Since $F_R$ is equal to $F_{R1}$, these terms cancel. Further, since the desired center frequency is the same in both cases:

$$N = \left(N_2 - \frac{N_2}{N_0}\right). \quad \text{Equation (6)}$$

As a result, Equation (5) may be rewritten as:

$$N_2 - \frac{N_2}{N_0} + \Delta N_{PLL} = N_2 - \frac{N_2}{N_0 + \Delta N_{FN\text{-}OPLL}}. \quad \text{Equation (7)}$$

Solving for $\Delta N_{FN\text{-}OPLL}$ provides:

$$\Delta N_{FN\text{-}OPLL} = \frac{-N_2}{\Delta N_{PLL} - \frac{N_2}{N_0}} - N_0. \quad \text{Equation (8)}$$

Thus, in the exemplary system above where:

$\Delta N_{FN\text{-}OPLL} = f'$ and $\Delta N_{PLL} = f_{DIST}$, the equation for $\Delta N_{FN\text{-}OPLL}$ may be rewritten as:

$$f' = \frac{-N_2}{f_{DIST} - \frac{N_2}{N_0}} - N_0. \quad \text{Equation (9)}$$

Base on either Equation (8) or (9), which are equivalent, the linearizer 90 operates to provide the linearized frequency signal (f') such that the output of the FN-OLL 92 is substantially linear with respect to the pre-distorted frequency signal ($f_{DIST}$). Again, as noted above, the digital pre-distortion circuitry 88 is optional and is not necessary for the present invention. As such, the linearizer 90 may alternatively receive the frequency signal output by the digital filter 86, rather than the pre-distorted frequency signal ($f_{DIST}$).

Looking at Equation (9), two divisions are necessary. Division is substantially more complex than multiplication or addition when implemented in digital logic. As such, in some implementations, it may be desirable to approximate Equation (9) using an Nth order approximation. As an example, the Taylor series expansion of Equation (9) is:

$$f' = N_0 \sum_{k=1}^{\infty} \left(\frac{N_0}{N_2} f_{DIST}\right)^k.$$

Note that the Taylor series expansion requires a single division ($N_0/N_2$), which is the same for each term. Depending on the particular implementation, a number of the terms in the Taylor series expansion may be used to approximate Equation (9).

For example, the first two terms of the Taylor series expansion may be used to approximate Equation (9) such that the approximation of Equation (9) becomes:

$$f' = N_0\left[\left(\frac{N_0}{N_2} f_{DIST}\right) + \left(\frac{N_0}{N_2} f_{DIST}\right)^2\right].$$

Using this second order approximation, the linearized frequency signal (f') may be computed during each transmit burst. For example, for either a GSM EDGE transmit burst, the ratio $N_0/N_2$ may be computed prior to the modulated portion of the transmit burst, such as during ramp-up for the transmit burst. Thereafter, the linearized frequency signal (f') may be continuously computed during the transmit burst as follows. More specifically, after computing the ratio $N_0/N_2$, a first multiplication may be performed to compute:

$$\frac{N_0}{N_2} f_{DIST}.$$

A second multiplication may then be performed to compute:

$$\left(\frac{N_0}{N_2} f_{DIST}\right)^2.$$

The results of the first and second multiplications may be summed to compute:

$$\left(\frac{N_0}{N_2} f_{DIST}\right) + \left(\frac{N_0}{N_2} f_{DIST}\right)^2.$$

Finally, a third multiplication may be performed to compute the linearized frequency signal (f') as:

$$N_0 \left[\left(\frac{N_0}{N_2} f_{DIST}\right) + \left(\frac{N_0}{N_2} f_{DIST}\right)^2\right].$$

Thus, with three continuous multipliers and an adder, along with an area efficient divider that computes the ratio $N_0/N_2$ prior to the modulated portion of the transmit burst, the output of the FN-OPLL 92 may be substantially linearized.

The equations above focus on high-side local oscillator injection in the feedback path of the first PLL 95. However, the present invention is also applicable for low-side local oscillator injection. For low-side local oscillator injection, the output of the FN-OPLL 92 may be represented as:

$$F_{VCO} = F_{R1}\left(N_2 + \frac{N_2}{N_1}\right), \quad \text{Equation (10)}$$

where $N_1$ is $N_{INT1}.\text{NUM1}$ and $N_2$ is $N_{INT2}.\text{NUM2}$. In order to illustrate the modulation, for low-side local oscillator injection, the output of the FN-OPLL 92 may be rewritten as:

$$F_{VCO} = F_{R1}\left(N_2 + \frac{N_2}{N_0 + \Delta N_{FN-OPLL}}\right). \quad \text{Equation (11)}$$

Using the same analysis as above for high-side local oscillator injection, the equation for the linearized frequency signal (f') becomes:

$$\Delta N_{FN-OPLL} = \frac{N_2}{\Delta N_{PLL} + \frac{N_2}{N_0}} - N_0, \quad \text{Equation (12)}$$

which, for the FN-PLL 92 of FIG. 3, may be rewritten as:

$$f' = \frac{N_2}{f_{DIST} + \frac{N_2}{N_0}} - N_0. \quad \text{Equation (13)}$$

The Taylor series expansion for Equation (12) may be written as:

$$\Delta N_{FN-OPLL} = N_0 \sum_{k=1}^{\infty} \left(-\frac{N_0}{N_2} \Delta N_{PLL}\right)^k. \quad \text{Equation (14)}$$

As discussed above, the linearizer 90 may provide the linearized frequency signal (f'), which is $\Delta N_{FN-OPLL}$ in the equations above, using a number of the terms in the Taylor series expansion as an approximation of Equation (12).

The present invention provides substantial opportunity for variation without departing from the spirit or scope of the present invention. For example, while the present invention is described above with respect to the modulator of FIG. 2 that operates in either a GMSK mode or 8PSK mode, the present invention is not limited thereto. The present invention is equally applicable to a modulator operating according a modulation scheme having a phase or frequency modulation component. For example, the present invention may be incorporated into a modulator operating according to a Wideband Code Division Multiple Access (WCDMA) modulation scheme.

Those skilled in the art will recognize improvements and modifications to the preferred embodiments of the present invention. All such improvements and modifications are considered within the scope of the concepts disclosed herein and the claims that follow.

What is claimed is:

1. A frequency synthesizer comprising:
   combiner circuitry adapted to combine an initial fractional divide value and a linearized modulation signal to provide a combined fractional divide value;
   a fractional-N divider adapted to fractionally divide a reference signal based on the combined fractional divide value to provide a divided reference signal;
   loop circuitry adapted to provide an output signal based on the divided reference signal and a feedback signal;
   feedback circuitry adapted to provide the feedback signal based on mixing the output signal and a local oscillator signal;
   second frequency synthesizer circuitry adapted to provide the local oscillator signal based on a control value; and
   linearization circuitry adapted to process a modulation signal to provide the linearized modulation signal such that a modulation component of the output signal has a substantially linear relationship to the modulation signal.

2. The frequency synthesizer of claim 1 wherein the linearization circuitry is further adapted to provide the linearized modulation signal based on the equation:

$$\Delta N_{FN-OPLL} = \frac{-N_2}{\Delta N_{PLL} - \frac{N_2}{N_0}} - N_0,$$

wherein $\Delta N_{FN-OPLL}$ is the linearized modulation signal, $\Delta N_{PLL}$ is the modulation signal, $N_0$ is the initial fractional divide value, and $N_2$ is the control value.

3. The frequency synthesizer of claim 1 wherein the linearization circuitry is further adapted to provide the linearized modulation signal based on an approximation of the equation:

$$\Delta N_{FN-OPLL} = \frac{-N_2}{\Delta N_{PLL} - \frac{N_2}{N_0}} - N_0,$$

wherein $\Delta N_{FN-OPLL}$ is the linearized modulation signal, $\Delta N_{PLL}$ is the modulation signal, $N_0$ is the initial fractional divide value, and $N_2$ is the control value.

4. The frequency synthesizer of claim 1 wherein the linearization circuitry is further adapted to provide the linearized modulation signal based on a number of terms selected from the equation:

$$\Delta N_{FN-OPLL} = N_0 \sum_{k=1}^{\infty} \left(\frac{N_0}{N_2} \Delta N_{PLL}\right)^k$$

wherein $\Delta N_{FN-OPLL}$ is the linearized modulation signal, $\Delta N_{PLL}$ is the modulation signal, $N_0$ is the initial fractional divide value, and $N_2$ is the control value.

5. The frequency synthesizer of claim 1 wherein the linearization circuitry is further adapted to provide the linearized modulation signal based on the equation:

$$\Delta N_{FN-OPLL} = N_0 \left[\left(\frac{N_0}{N_2} \Delta N_{PLL}\right) + \left(\frac{N_0}{N_2} \Delta N_{PLL}\right)^2\right]$$

wherein $\Delta N_{FN-OPLL}$ is the linearized modulation signal, $\Delta N_{PLL}$ is the modulation signal, $N_0$ is the initial fractional divide value, and $N_2$ is the control value.

6. The frequency synthesizer of claim 1 wherein the linearization circuitry is further adapted to provide the linearized modulation signal based on the equation:

$$\Delta N_{FN-OPLL} = \frac{N_2}{\Delta N_{PLL} \frac{N_2}{N_0}} - N_0,$$

wherein $\Delta N_{FN-OPLL}$ is the linearized modulation signal, $\Delta N_{PLL}$ is the modulation signal, $N_0$ is the initial fractional divide value, and $N_2$ is the control value.

7. The frequency synthesizer of claim 1 wherein the linearization circuitry is further adapted to provide the linearized modulation signal based on an approximation of the equation:

$$\Delta N_{FN-OPLL} = \frac{N_2}{\Delta N_{PLL} + \frac{N_2}{N_0}} - N_0,$$

wherein $\Delta N_{FN-OPLL}$ is the linearized modulation signal, $\Delta N_{PLL}$ is the modulation signal, $N_0$ is the initial fractional divide value, and $N_2$ is the control value.

8. The frequency synthesizer of claim 1 wherein the linearization circuitry is further adapted to provide the linearized modulation signal based on a number of terms selected from the equation:

$$\Delta N_{FN-OPLL} = N_0 \sum_{k=1}^{\infty} \left(-\frac{N_0}{N_2} \Delta N_{PLL}\right)^k$$

wherein $\Delta N_{FN-OPLL}$ is the linearized modulation signal, $\Delta N_{PLL}$ is the modulation signal, $N_0$ is the initial fractional divide value, and $N_2$ is the control value.

9. The frequency synthesizer of claim 1 wherein the linearization circuitry is further adapted to provide the linearized modulation signal based on the equation:

$$\Delta N_{FN-OPLL} = N_0 \left[\left(-\frac{N_0}{N_2} \Delta N_{PLL}\right) + \left(-\frac{N_0}{N_2} \Delta N_{PLL}\right)^2\right]$$

wherein $\Delta N_{FN-OPLL}$ is the linearized modulation signal, $\Delta N_{PLL}$ is the modulation signal, $N_0$ is the initial fractional divide value, and $N_2$ is the control value.

10. The frequency synthesizer of claim 1 wherein the loop circuitry comprises:
a phase detector adapted to compare a phase of the divided reference signal to a phase of the feedback signal;
a loop filter adapted to filter an output of the phase detector to provide a control signal; and
controlled oscillator circuitry adapted to provide the output signal based on the control signal.

11. The frequency synthesizer of claim 10 wherein the feedback circuitry comprises mixer circuitry adapted to multiply the output signal and the local oscillator signal to provide the feedback signal.

12. The frequency synthesizer of claim 11 wherein the feedback circuitry further comprises filtering circuitry adapted to filter the feedback signal prior to providing the feedback signal to the phase detector.

13. The frequency synthesizer of claim 1 wherein the second frequency synthesizer circuitry comprises a phase locked loop (PLL) and the control value is a second fractional divide value, such that the initial fractional divide value and the second fractional divide value are provided to control a center frequency of the output signal.

14. The frequency synthesizer of claim 1 wherein an output of the second frequency synthesizer circuitry is coupled to an input of the fractional-N divider to provide the reference signal.

15. The frequency synthesizer of claim 1 wherein the combiner circuitry has a digital interface and the linearized modulation signal is a digital signal.

16. The frequency synthesizer of claim 15 wherein the frequency synthesizer is part of modulation circuitry in a transmitter of a mobile terminal and the modulation circuitry provides an all digital path from processing circuitry of the mobile terminal to the digital interface of the combiner circuitry.

17. A method comprising:
combining an initial fractional divide value and a linearized modulation signal to provide a combined fractional divide value;
fractionally dividing a reference signal based on the combined fractional divide value to provide a divided reference signal;
providing an output signal based on the divided reference signal and a feedback signal;
providing the feedback signal based on mixing the output signal and a local oscillator signal;
providing the local oscillator signal based on a control value; and
processing a modulation signal to provide the linearized modulation signal such that a modulation component of the output signal has a substantially linear relationship to the modulation signal.

18. The method of claim 17 wherein processing the modulation signal comprises processing the modulation signal to provide the linearized modulation signal based on the equation:

$$\Delta N_{FN-OPLL} = \frac{-N_2}{\Delta N_{PLL} - \frac{N_2}{N_0}} - N_0,$$

wherein $\Delta N_{FN-OPLL}$ is the linearized modulation signal, $\Delta N_{PLL}$ is the modulation signal, $N_0$ is the initial fractional divide value, and $N_2$ is the control value.

19. The method of claim 17 wherein processing the modulation signal comprises processing the modulation signal to provide the linearized modulation signal based on an approximation of the equation:

$$\Delta N_{FN-OPLL} = \frac{-N_2}{\Delta N_{PLL} - \frac{N_2}{N_0}} - N_0,$$

wherein $\Delta N_{FN-OPLL}$ is the linearized modulation signal, $\Delta N_{PLL}$ is the modulation signal, $N_0$ is the initial fractional divide value, and $N_2$ is the control value.

20. The method of claim 17 wherein processing the modulation signal comprises processing the modulation signal to provide the linearized modulation signal based on the equation:

$$\Delta N_{FN-OPLL} = \frac{N_2}{\Delta N_{PLL} + \frac{N_2}{N_0}} - N_0,$$

wherein $\Delta N_{FN-OPLL}$ is the linearized modulation signal, $\Delta N_{PLL}$ is the modulation signal, $N_0$ is the initial fractional divide value, and $N_2$ is the control value.

21. The method of claim 17 wherein processing the modulation signal comprises processing the modulation signal to provide the linearized modulation signal based on an approximation of the equation:

$$\Delta N_{FN-OPLL} = \frac{N_2}{\Delta N_{PLL} + \frac{N_2}{N_0}} - N_0,$$

wherein $\Delta N_{FN-OPLL}$ is the linearized modulation signal, $\Delta N_{PLL}$ is the modulation signal, $N_0$ is the initial fractional divide value, and $N_2$ is the control value.

* * * * *

UNITED STATES PATENT AND TRADEMARK OFFICE
CERTIFICATE OF CORRECTION

PATENT NO.       : 7,449,960 B2
APPLICATION NO.  : 11/415808
DATED            : November 11, 2008
INVENTOR(S)      : Bunch et al.

It is certified that error appears in the above-identified patent and that said Letters Patent is hereby corrected as shown below:

In column 9, at line 56, replace the existing equation with the following equation:

$$g_{pd}(t) = \int_0^\infty g(t-u) Laplace^{-1}\{1/H(s), u\} du$$

At column 10, at line 11, replace the existing equation with the following equation:

$$g(t) = \int_{t-\frac{T}{2}}^{t+\frac{T}{2}} \frac{h_{mod}(x)}{T} dx$$

Signed and Sealed this

Second Day of June, 2009

JOHN DOLL
*Acting Director of the United States Patent and Trademark Office*